US010670978B2

(12) United States Patent
Leung et al.

(10) Patent No.: US 10,670,978 B2
(45) Date of Patent: Jun. 2, 2020

(54) METHOD AND APPARATUS FOR SPECTRALLY BROADENING RADIATION (71) Applicant: ASML HOLDING N.V., Veldhoven (NL)

(72) Inventors: King Pui Leung, Wilton, CT (US); Tao Chen, Wilton, CT (US); Kevin J. Violette, Wilton, CT (US)

(73) Assignee: ASML Holding N.V., Veldhoven (NL)

( * ) Notice: Subject to any disclaimer, the term of this patent is extended or adjusted under 35 U.S.C. 154(b) by 0 days.

(21) Appl. No.: 15/505,874

(22) PCT Filed: Aug. 11, 2015

(86) PCT No.: PCT/EP2015/068407
§ 371 (c)(1),
(2) Date: Feb. 22, 2017

(87) PCT Pub. No.: WO2016/030177
PCT Pub. Date: Mar. 3, 2016

(65) Prior Publication Data
US 2017/0277046 A1    Sep. 28, 2017

Related U.S. Application Data

(60) Provisional application No. 62/044,074, filed on Aug. 29, 2014.

(51) Int. Cl.
*G03F 9/00*     (2006.01)
*G01B 11/27*    (2006.01)
(Continued)

(52) U.S. Cl.
CPC .......... *G03F 9/7065* (2013.01); *G01B 11/272* (2013.01); *G02B 6/02214* (2013.01);
(Continued)

(58) Field of Classification Search
CPC ......... G03F 9/00; G03F 9/7065; G01B 11/27; G01B 11/272; G02B 6/02; G02B 6/02214; G02B 27/48; G01N 21/86
See application file for complete search history.

(56) References Cited

U.S. PATENT DOCUMENTS 5,477,057 A * 12/1995 Angeley ............. G03F 7/70358
250/548
7,345,739 B2    3/2008 Hendriks et al.
(Continued)

FOREIGN PATENT DOCUMENTS

EP    1 455 235    9/2004
JP    S61235807    10/1986
(Continued)

OTHER PUBLICATIONS

International Search Report and Written Opinion dated Nov. 2, 2015 in corresponding International Patent Application No. PCT/EP2015/068407.
(Continued)

*Primary Examiner* — Jamil Ahmed
(74) *Attorney, Agent, or Firm* — Pillsbury Winthrop Shaw Pittman LLP (57) ABSTRACT

A spectrally broadened radiation apparatus, including a laser configured to emit, through an output of the laser, radiation substantially only in the visible region of the electromagnetic spectrum, the radiation having a nominal wavelength, and an optical fiber optically coupled to the output of the laser, the optical fiber having an input to receive the radiation from the laser and having an output to provide spectrally broadened output radiation, the optical fiber configured to spectrally broaden the radiation from the laser to a spectral width of at least 0.5 nm around the nominal wavelength.

23 Claims, 5 Drawing Sheets

(51) Int. Cl.
  *G02B 6/02* (2006.01)
  *G03F 7/20* (2006.01)
(52) U.S. Cl.
  CPC ...... *G03F 7/70625* (2013.01); *G03F 7/70633* (2013.01); *G03F 9/7088* (2013.01)

(56) References Cited

U.S. PATENT DOCUMENTS

| | | |
|---|---|---|
| 7,570,358 B2 | 8/2009 | Den Boef |
| 7,791,732 B2 | 9/2010 | Den Boef et al. |
| 8,797,554 B2 | 8/2014 | Straaijer |
| 2005/0244162 A1* | 11/2005 | Evans ................ H04B 10/299 398/98 |
| 2006/0066855 A1 | 3/2006 | Den Boef et al. |
| 2006/0215716 A1* | 9/2006 | Luo ...................... H01S 5/0687 372/38.08 |
| 2008/0239265 A1 | 10/2008 | Den Boef |
| 2009/0252467 A1 | 10/2009 | Okuno |
| 2013/0308142 A1 | 11/2013 | Straaijer |
| 2014/0071406 A1* | 3/2014 | Manni .................. G02B 27/48 353/31 |

FOREIGN PATENT DOCUMENTS

| | | |
|---|---|---|
| JP | H0277246 | 3/1990 |
| JP | H08-190202 | 7/1996 |
| JP | 2001108869 | 4/2001 |
| JP | 2001264829 | 9/2001 |
| JP | 2004-343057 | 12/2004 |
| JP | 2008-262004 | 10/2008 |
| JP | 2008-263187 | 10/2008 |
| JP | 2012083476 | 4/2012 |
| JP | 2013533506 | 8/2013 |

OTHER PUBLICATIONS

Taiwan Office Action dated Jul. 20, 2016 in corresponding Taiwan Patent Application No. 104126274.
Taiwan Office Action dated Dec. 16, 2016 in corresponding Taiwan Patent Application No. 104126274.
I. Procino et al., "Hollow-fiber compression of visible, 200 fs laser pulses to 40 fs pulse duration," Optics Letters, vol. 32, No. 13, pp. 1866-1868 (Jul. 1, 2007).
Notice of Reasons for Rejection issued in corresponding Japanese Patent Application No. 2017-506710, dated Mar. 22, 2018.
Japanese Office Action issued in corresponding Japanese Patent Application No. 2017-506710, dated Sep. 19, 2018.
Japanese Office Action issued in corresponding Japanese Patent Application No. 2017-506710, dated May 14, 2019.

* cited by examiner

METHOD AND APPARATUS FOR SPECTRALLY BROADENING RADIATION

CROSS REFERENCE TO RELATED APPLICATIONS

This application is the U.S. national phase entry of PCT patent application no. PCT/EP2015/068407, which was filed on Aug. 11, 2015, which claims the benefit of priority of U.S. provisional application No. 62/044,074 which was filed on Aug. 29, 2014, and which is incorporated herein in its entirety by reference.

FIELD

The present description relates to methods and apparatus for providing a spectrally broadened radiation source.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., including part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti parallel to this direction. It is also possible to transfer the pattern from the patterning device to the substrate by imprinting the pattern onto the substrate.

In lithographic processes, it is desirable to make measurements using an optical measuring technique. For example, with the aid of a lithographic apparatus, different patterns are successively imaged at a precisely aligned position onto the substrate. The substrate may undergo physical and chemical changes between the successive images that have been aligned with each other. The substrate is removed from the apparatus after it has been exposed with the image of at least one pattern, and, after it has undergone the desired process steps, the substrate is placed back in order to expose it with an image of a further pattern, and so forth, while it must be ensured that the images of the further pattern and any subsequent patterns are positioned accurately with respect to the at least one already exposed image on the substrate. To this end, the substrate is provided with alignment marks to provide a reference location on the substrate, and the lithographic apparatus is provided with an alignment system to measure the alignment position of the alignment marks. By measuring the alignment position of the alignment marks, in principle the position of every point on the substrate can be predicted, i.e., the location of a previously exposed target portion can be calculated and the lithographic apparatus can be controlled to expose a successive target portion on top of the previously exposed target portion.

Usually, the alignment marks on the substrate are diffraction structures such as diffraction gratings. The alignment system then comprises an alignment sensor system with a radiation source to emit radiation towards the grating and a detector to detect the diffraction pattern in the reflected radiation, i.e., sub-beams diffracted in a first, third and/or higher order are used, in order to determine the position of the grating.

Further, it is desirable to make measurements of the structures created (e.g., the device features in resist and/or other layer on or of the substrate), e.g., for process control and verification. One or more parameters of the structures are typically measured or determined, for example the overlay error between successive layers formed in or on the substrate. There are various techniques for making measurements of the microscopic structures formed in a lithographic process. Various tools for making such measurements are known, including scanning electron microscopes, which are often used to measure critical dimension (CD), and specialized tools to measure overlay, the accuracy of alignment of two layers in a device. An example of such a tool is a scatterometer developed for use in the lithographic field. This device directs a beam of radiation onto a target on the surface of the substrate and measures one or more properties of the redirected radiation—e.g., intensity at a single angle of reflection as a function of wavelength; intensity at one or more wavelengths as a function of reflected angle; or polarization as a function of reflected angle—to obtain a "spectrum" from which a property of interest of the target can be determined. Determination of the property of interest may be performed by various techniques: e.g., reconstruction of the target structure by iterative approaches such as rigorous coupled wave analysis or finite element methods, library searches, and principal component analysis. Like with alignment, the target may be a diffraction grating, e.g., typically a compound grating of a grating in one layer overlaid by another grating in another layer.

SUMMARY

Many optical measurement systems (e.g., lithography alignment and/or overlay sensors) benefit from a bright radiation source that has a broad spectral width and hence short coherent length for precise alignment. An example radiation source is a radiation source with a wavelength in the green, e.g., in the range of about 495-570 nm. However, a reliable bright radiation source with short coherence length, and accurate, and stable center wavelength is difficult to obtain, particularly in the green region of electromagnetic spectrum.

A high power radiation source, such as a light emitting diode (LED), has a short coherence length due to its broad spectral width but lacks adequate spectral radiance brightness. On the other hand, lasers, such as laser diodes, are inherently bright but have a long coherent length which introduces undesirable coherence effects in optical sensors. Efforts made to reduce their coherent lengths by broadening their spectral widths with various hi-speed modulation techniques tend to make the radiation source system complex and unreliable. Additionally, the green spectral region happens to lie between the blue region of GaN-based emitters and the red region of GaAs-based or InP-based emitters. This has resulted in the lack of good or reliable semiconductor emitter materials in the green spectral region. Consequently, a bright green semiconductor radiation source with short coherent length, like the super luminescent diode, is intrinsically unreliable and difficult to make.

It is desirable, for example, to provide a broad spectrum radiation source with short coherent length. Furthermore, although not limited to this, it would be advantageous that the radiation source is reliable and compact, and has a bright spectral radiance.

In an aspect, there is provided a method for providing a broad spectrum radiation source. The method may include coupling a green laser to a first end of an optical fiber, and modulating a parameter thereof such that an output radiation at a second end of the optical fiber has a spectral width of at least 0.5 nm around a wavelength of the green laser. The method may further include modulating the power of the laser, the length of the optical fiber, and/or the core size of the optical fiber.

In an aspect, there is provided a method for providing a broad spectrum radiation source. The method may include coupling a visible laser to a first end of an optical fiber, and modulating a parameter thereof such that an output radiation at a second end of the optical fiber has a spectral width of at least about 400 nm around a wavelength of the visible laser. The method may further include modulating the power of the laser, the length of the optical fiber, and/or the core size of the optical fiber.

BRIEF DESCRIPTION OF THE DRAWINGS

Embodiments will now be described, by way of example only, with reference to the accompanying drawings in which.

DETAILED DESCRIPTION

Before describing embodiments in detail, it is instructive to present an example environment in which embodiments may be implemented.

Figure 1:
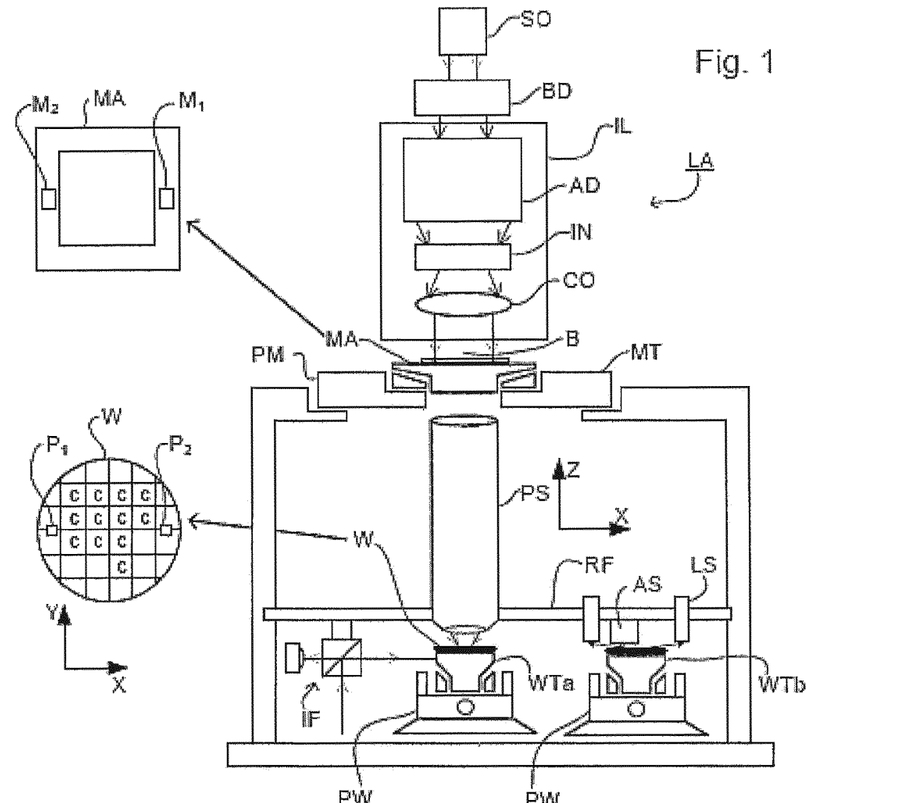
FIG. 1 schematically depicts an embodiment of a lithographic apparatus.

FIG. 1 schematically depicts a lithographic apparatus LA. The apparatus comprises:

an illumination system (illuminator) IL configured to condition a radiation beam B (e.g. DUV radiation or EUV radiation);

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WTa constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The patterning device support structure holds the patterning device in a manner that depends on the orientation of the patterning device, the design of the lithographic apparatus, and other conditions, such as for example whether or not the patterning device is held in a vacuum environment. The patterning device support structure can use mechanical, vacuum, electrostatic or other clamping techniques to hold the patterning device. The patterning device support structure may be a frame or a table, for example, which may be fixed or movable as required. The patterning device support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g., employing a transmissive mask). Alternatively, the apparatus may be of a reflective type (e.g., employing a programmable mirror array of a type as referred to above, or employing a reflective mask).

The lithographic apparatus may be of a type having two (dual stage) or more tables (e.g., two or more substrate table, two or more patterning device support structures, or a substrate table and metrology table). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross section.

The radiation beam B is incident on the patterning device (e.g., mask) MA, which is held on the patterning device support (e.g., mask table) MT, and is patterned by the patterning device. Having traversed the patterning device (e.g., mask) MA, the radiation beam B passes through the projection system PS, which focuses the beam onto a target portion C of the substrate W. With the aid of the second positioner PW and position sensor IF (e.g., an interferometric device, linear encoder, 2-D encoder or capacitive sensor), the substrate table WTa can be moved accurately, e.g., so as to position different target portions C in the path of the radiation beam B. Similarly, the first positioner PM and another position sensor (which is not explicitly depicted in FIG. 1) can be used to accurately position the patterning device (e.g., mask) MA with respect to the path of the radiation beam B, e.g., after mechanical retrieval from a mask library, or during a scan. In general, movement of the patterning device support (e.g., mask table) MT may be realized with the aid of a long-stroke module (coarse positioning) and a short-stroke module (fine positioning), which form part of the first positioner PM. Similarly, movement of the substrate table WTa may be realized using a long-stroke module and a short-stroke module, which form part of the second positioner PW. In the case of a stepper (as opposed to a scanner) the patterning device support (e.g., mask table) MT may be connected to a short-stroke actuator only, or may be fixed.

Patterning device (e.g., mask) MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g., mask) MA, the patterning device alignment marks may be located between the dies. Small alignment markers may also be included within dies, in amongst the device features, in which case it is desirable that the markers be as small as possible and not require any different imaging or process conditions than adjacent features. The alignment system, which detects the alignment markers, is described further below.

The depicted apparatus could be used in at least one of the following modes:

1. In step mode, the patterning device support (e.g., mask table) MT and the substrate table WTa are kept essentially stationary, while an entire pattern imparted to the radiation beam is projected onto a target portion C at one time (i.e., a single static exposure). The substrate table WTa is then shifted in the X and/or Y direction so that a different target portion C can be exposed. In step mode, the maximum size of the exposure field limits the size of the target portion C imaged in a single static exposure.

2. In scan mode, the patterning device support (e.g., mask table) MT and the substrate table WTa are scanned synchronously while a pattern imparted to the radiation beam is projected onto a target portion C (i.e., a single dynamic exposure). The velocity and direction of the substrate table WTa relative to the patterning device support (e.g., mask table) MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the patterning device support (e.g., mask table) MT is kept essentially stationary holding a programmable patterning device, and the substrate table WTa is moved or scanned while a pattern imparted to the radiation beam is projected onto a target portion C. In this mode, generally a pulsed radiation source is employed and the programmable patterning device is updated as required after each movement of the substrate table WTa or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Lithographic apparatus LA is of a so-called dual stage type which has two tables WTa, WTb (e.g., two substrate tables) and two stations—an exposure station and a measurement station—between which the tables can be exchanged. For example, while a substrate on one table is being exposed at the exposure station, another substrate can be loaded onto the other substrate table at the measurement station and various preparatory steps carried out. The preparatory steps may include mapping the surface control of the substrate using a level sensor LS and measuring the position of alignment markers on the substrate using an alignment sensor AS, both sensors being supported by a reference frame RF. If the position sensor IF is not capable of measuring the position of a table while it is at the measurement station as well as at the exposure station, a second position sensor may be provided to enable the positions of the table to be tracked at both stations. As another example, while a substrate on one table is being exposed at the exposure station, another table without a substrate waits at the measurement station (where optionally measurement activity may occur). This other table has one or more measurement devices and may optionally have other tools (e.g., cleaning apparatus). When the substrate has completed exposure, the table without a substrate moves to the exposure station to perform, e.g., measurements and the table with the substrate moves to a location (e.g., the measurement station) where the substrate is unloaded and another substrate is load. These multi-table arrangements enable a substantial increase in the throughput of the apparatus.

Figure 2:
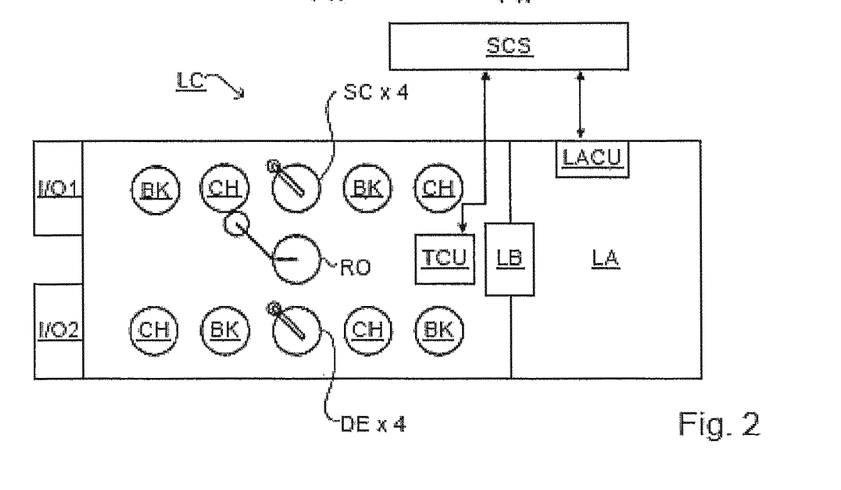
FIG. 2 schematically depicts an embodiment of a lithographic cell or cluster.

As shown in FIG. 2, the lithographic apparatus LA forms part of a lithographic cell LC, also sometimes referred to as a lithocell or lithocluster, which also includes apparatus to perform one or more pre- and post-exposure processes on a substrate. Conventionally these include one or more spin coaters SC to deposit a resist layer, one or more developers DE to develop exposed resist, one or more chill plates CH and one or more bake plates BK. A substrate handler, or robot, RO picks up a substrate from input/output ports I/O1, I/O2, moves it between the different process devices and delivers it to the loading bay LB of the lithographic apparatus. These devices, which are often collectively referred to as the track, are under the control of a track control unit TCU which is itself controlled by the supervisory control system SCS, which also controls the lithographic apparatus via lithographic control unit LACU. Thus, the different apparatus may be operated to maximize throughput and processing efficiency.

As described above, a substrate (and/or a substrate table and/or the patterning device) may be provided with alignment marks to provide a reference location on the substrate, and the lithographic apparatus is provided with an alignment system to measure the alignment position of the alignment marks. By measuring the alignment position of the alignment marks, in principle the position of every point on the substrate can be predicted, i.e., the location of a previously exposed target portion can be calculated and the lithographic apparatus can be controlled to expose a successive target portion on top of the previously exposed target portion.

Usually, the alignment marks on the substrate are diffraction gratings. The alignment system of the lithographic apparatus then comprises an alignment sensor system with a radiation source to emit radiation towards the grating and a detector to detect the diffraction pattern in the reflected radiation, i.e., sub-beams diffracted in a first, third and/or higher order are used, in order to determine the position of the grating.

Further, in order that the substrate that is exposed by the lithographic apparatus is exposed correctly and consistently, it is desirable to inspect an exposed substrate to measure one or more properties such as overlay error between subsequent layers, line thickness, critical dimension (CD), etc. If an error is detected, an adjustment may be made to an exposure of one or more subsequent substrates, especially if the inspection can be done soon and fast enough that another substrate of the same batch is still to be exposed. Also, an already exposed substrate may be stripped and reworked (to improve yield) or discarded, thereby avoiding performing an exposure on a substrate that is known to be faulty. In a case where only some target portions of a substrate are faulty, a further exposure may be performed only on those target portions which are good. Another possibility is to adapt a setting of a subsequent process step to compensate for the error, e.g. the time of a trim etch step can be adjusted to compensate for substrate-to-substrate CD variation resulting from the lithographic process step.

An inspection apparatus is used to determine one or more properties of a substrate, and in particular, how one or more properties of different substrates or different layers of the same substrate vary from layer to layer and/or across a substrate. The inspection apparatus may be integrated into the lithographic apparatus LA or the lithocell LC or may be a stand-alone device. To enable most rapid measurements, it is desirable that the inspection apparatus measure one or more properties in the exposed resist layer immediately after the exposure. However, the latent image in the resist has a very low contrast—there is only a very small difference in refractive index between the part of the resist which has been exposed to radiation and that which has not—and not all inspection apparatus have sufficient sensitivity to make useful measurements of the latent image. Therefore measurements may be taken after the post-exposure bake step (PEB) which is customarily the first step carried out on an exposed substrate and increases the contrast between exposed and unexposed parts of the resist. At this stage, the image in the resist may be referred to as semi-latent. It is also possible to make measurements of the developed resist image—at which point either the exposed or unexposed parts of the resist have been removed—or after a pattern transfer step such as etching. The latter possibility limits the possibility for rework of a faulty substrate but may still provide useful information, e.g. for the purpose of process control.

Figure 3:
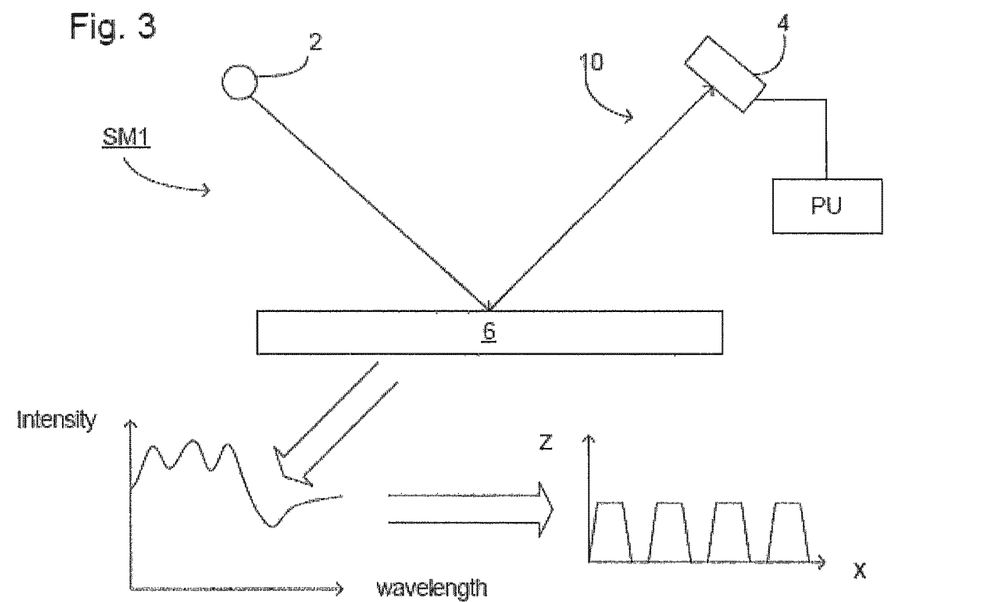
FIG. 3 schematically depicts an embodiment of a measurement apparatus.

FIG. 3 depicts an embodiment of a measurement apparatus SM1. It comprises a radiation projector 2 (e.g. broadband (white light) radiation projector) which projects radiation onto a target (e.g., a diffracting grating) of a substrate 6. The reflected radiation is passed to a detector 4 (e.g., spectrometer detector), which, in this case, measures a spectrum 10 (i.e. a measurement of intensity as a function of wavelength) of the specular reflected radiation. From this data, the structure or profile giving rise to the detected spectrum may be reconstructed by processing unit PU, e.g. by Rigorous Coupled Wave Analysis and non-linear regression or by comparison with a library of simulated spectra as shown at the bottom of FIG. 3. In general, for the reconstruction, the general form of the structure is known and some parameters are assumed from knowledge of the process by which the structure was made, leaving only a few parameters of the structure to be determined from the scatterometry data. Such a scatterometer may be configured as a normal-incidence scatterometer or an oblique-incidence scatterometer.

Figure 4:
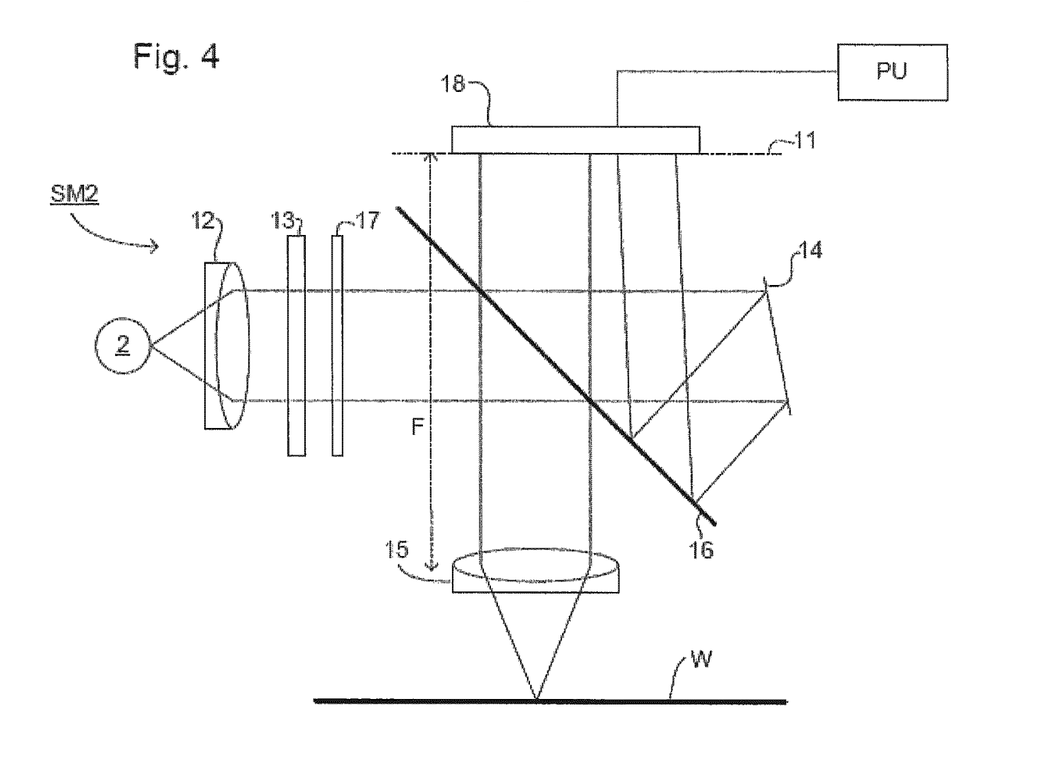
FIG. 4 schematically depicts a further embodiment of a measurement apparatus.

Another embodiment of a measurement apparatus SM2 is shown in FIG. 4. In this device, the radiation emitted by radiation source 2 is focused using lens system 12 through interference filter 13 and polarizer 17, reflected by partially reflective surface 16 and is focused onto a target of substrate W via an objective lens 15, which has a high numerical aperture (NA), desirably at least 0.9 or at least 0.95. An immersion measurement (using liquid between the lens 15 and the substrate W) may even have a lens with a numerical aperture over 1. The reflected radiation then transmits through partially reflective surface 16 into a detector 18 in order to have the scattered radiation detected. The detector may be located in the back-projected pupil plane 11, which is at the focal length of the lens 15, however the pupil plane may instead be re-imaged with auxiliary optics (not shown) onto the detector 18. The pupil plane is the plane in which the radial position of radiation defines the angle of incidence and the angular position defines the azimuth angle of the radiation. The detector is, for example, a two-dimensional detector so that a two-dimensional angular scatter spectrum (i.e. a measurement of intensity as a function of angle of scatter) of the substrate target can be measured. The detector 18 may be, for example, an array of CCD or CMOS sensors, and may have an integration time of, for example, 40 milliseconds per frame.

A reference beam is often used, for example, to measure the intensity of the incident radiation. To do this, when the radiation beam is incident on the partially reflective surface 16 part of it is transmitted through the surface as a reference beam towards a reference mirror 14. The reference beam is then projected onto a different part of the same detector 18.

One or more interference filters 13 are available to select a wavelength of interest in the range of, say, 405-790 nm or even lower, such as 200-300 nm. The interference filter(s) may be tunable rather than comprising a set of different filters. A grating could be used instead of or in addition to one or more interference filters.

The detector 18 may measure the intensity of scattered radiation at a single wavelength (or narrow wavelength range), the intensity separately at multiple wavelengths or the intensity integrated over a wavelength range. Further, the detector may separately measure the intensity of transverse magnetic—(TM) and transverse electric—(TE) polarized radiation and/or the phase difference between the transverse magnetic- and transverse electric-polarized radiation.

Using a broadband radiation source 2 (i.e. one with a wide range of radiation frequencies or wavelengths—and therefore of colors) is possible, which gives a large etendue, allowing the mixing of multiple wavelengths. The plurality of wavelengths in the broadband desirably each has a bandwidth of $\delta\lambda$ and a spacing of at least $2\delta\lambda$ (i.e. twice the wavelength bandwidth). Several "sources" of radiation may be different portions of an extended radiation source which have been split using, e.g., fiber bundles. In this way, angle resolved scatter spectra may be measured at multiple wavelengths in parallel. A 3-D spectrum (wavelength and two different angles) may be measured, which contains more information than a 2-D spectrum. This allows more information to be measured which increases metrology process robustness. This is described in more detail in U.S. patent application publication no. US 2006-0066855, which document is hereby incorporated in its entirety by reference.

By comparing one or more properties of the beam before and after it has been redirected by the target, one or more properties of the substrate may be determined. This may be done, for example, by comparing the redirected beam with theoretical redirected beams calculated using a model of the substrate and searching for the model that gives the best fit between measured and calculated redirected beams. Typically a parameterized generic model is used and the parameters of the model, for example width, height and sidewall angle of the pattern, are varied until the best match is obtained.

Two main types of scatterometer are used. A spectroscopic scatterometer directs a broadband radiation beam onto the substrate and measures the spectrum (intensity as a function of wavelength) of the radiation scattered into a particular narrow angular range. An angularly resolved scatterometer uses a monochromatic radiation beam and measures the intensity (or intensity ratio and phase difference in case of an ellipsometric configuration) of the scattered radiation as a function of angle. Alternatively, measurement signals of different wavelengths may be measured separately and combined at an analysis stage. Polarized radiation may be used to generate more than one spectrum from the same substrate.

In order to determine one or more parameters of the substrate, a best match is typically found between the theoretical spectrum produced from a model of the substrate and the measured spectrum produced by the redirected beam as a function of either wavelength (spectroscopic scatterometer) or angle (angularly resolved scatterometer). To find the best match there are various methods, which may be combined. For example, a first method is an iterative search method, where a first set of model parameters is used to calculate a first spectrum, a comparison being made with the measured spectrum. Then a second set of model parameters is selected, a second spectrum is calculated and a comparison of the second spectrum is made with the measured spectrum. These steps are repeated with the goal of finding the set of parameters that gives the best matching spectrum. Typically, the information from the comparison is used to steer the selection of the subsequent set of parameters. This process is known as an iterative search technique. The model with the set of parameters that gives the best match is considered to be the best description of the measured substrate.

A second method is to make a library of spectra, each spectrum corresponding to a specific set of model parameters. Typically the sets of model parameters are chosen to cover all or almost all possible variations of substrate properties. The measured spectrum is compared to the spectra in the library. Similarly to the iterative search method, the model with the set of parameters corresponding to the spectrum that gives the best match is considered to be the best description of the measured substrate. Interpolation techniques may be used to determine more accurately the best set of parameters in this library search technique.

In any method, sufficient data points (wavelengths and/or angles) in the calculated spectrum should be used in order to enable an accurate match, typically between 80 up to 800 data points or more for each spectrum. Using an iterative method, each iteration for each parameter value would involve calculation at 80 or more data points. This is multiplied by the number of iterations needed to obtain the correct profile parameters. Thus many calculations may be required. In practice this leads to a compromise between accuracy and speed of processing. In the library approach, there is a similar compromise between accuracy and the time required to set up the library.

In any of the measurement apparatus described above, the target on substrate W may be a grating which is printed such that after development, the bars are formed of solid resist lines. The bars may alternatively be etched into the substrate.

In an embodiment, the target pattern is chosen to be sensitive to a parameter of interest, such as focus, dose, overlay, chromatic aberration in the lithographic projection apparatus, etc., such that variation in the relevant parameter will manifest as variation in the printed target. For example, the target pattern may be sensitive to chromatic aberration in the lithographic projection apparatus, particularly the projection system PL, and illumination symmetry and the presence of such aberration will manifest itself in a variation in the printed target pattern. Accordingly, the scatterometry data of the printed target pattern is used to reconstruct the target pattern. The parameters of the target pattern, such as line width and shape, may be input to the reconstruction process, performed by a processing unit PU, from knowledge of the printing step and/or other scatterometry processes.

While embodiments of a scatterometer have been described herein, other types of metrology apparatus may be used in an embodiment. For example, a dark field metrology apparatus such as described in U.S. Patent Application Publication No. 2013-0308142, which is incorporated herein in its entirety by reference, may be used. Further, those other types of metrology apparatus may use a completely different technique than scatterometry.

And while examples of an inspection apparatus have been described (mostly operating on scatterometry principles), an alignment apparatus operates on similar principles of providing radiation from a source onto a target (e.g., an alignment grating), detecting diffracted radiation using a detector and analyzing the detected radiation to determine alignment.

Figure 5:
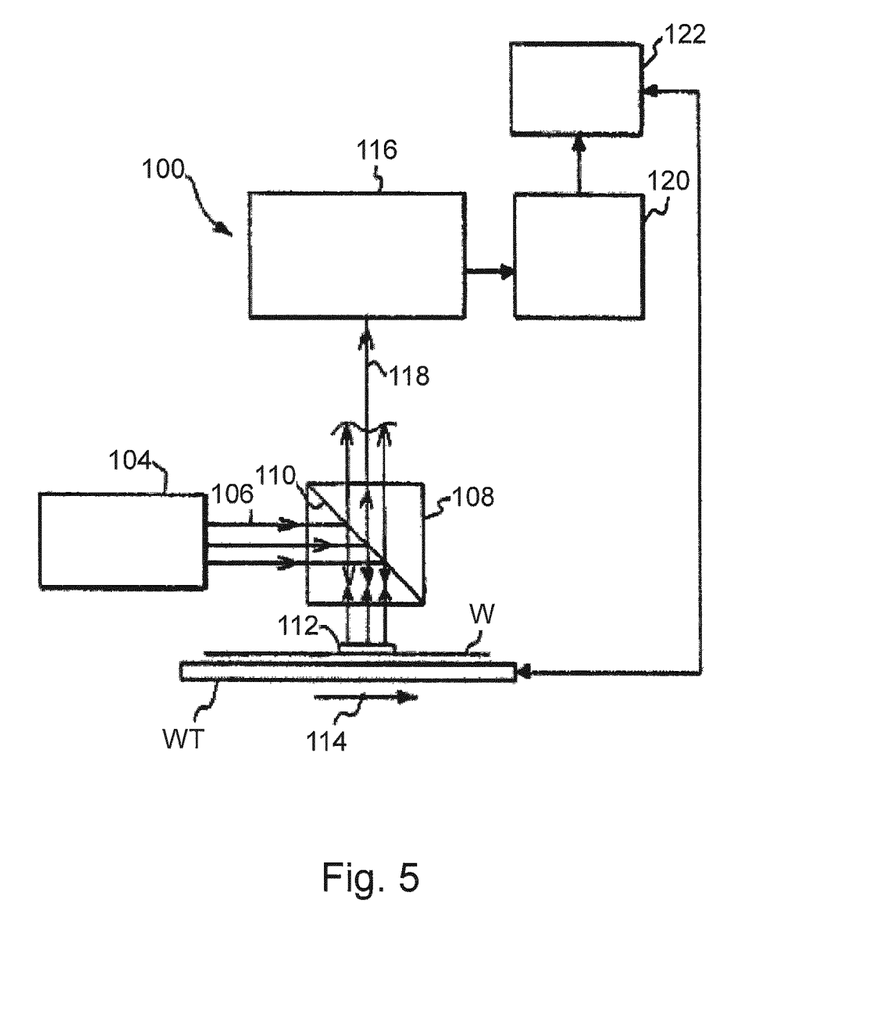
FIG. 5 schematically depicts an alignment sensor apparatus.

FIG. 5 is a schematic diagram illustrating an example alignment system 100. The alignment system 100 comprises a coherent illumination source 104, such as a laser, providing electromagnetic radiation 106, to a prism 108. At least a portion of the electromagnetic radiation is reflected off coating 110 to illuminate an alignment mark or target 112. The alignment mark or target 112 may have one hundred and eighty degree symmetry. By one hundred and eighty degree symmetry, it is meant that when the alignment mark 112 (also referred to as a "target") is rotated one hundred and eighty degree about an axis of symmetry perpendicular to the plane of the alignment mark 112, the alignment mark is substantially identical to the unrotated alignment mark. The axis for which this is true is called the axis of symmetry. The alignment mark 112 is placed on a substrate or wafer W that may be coated with a radiation-sensitive film.

The substrate W is placed on a substrate table WT. The substrate table WT may be scanned in the direction indicated by arrow 114. Electromagnetic radiation reflected from the alignment mark 112 passes through the prism 108 and is collected by an image rotation interferometer 116. It should be appreciated that a good quality image need not be formed, but that the features of the alignment mark should be resolved. The image rotation interferometer 116 may be any appropriate set of optical-elements, and is, in an embodiment, a combination of prisms, that form two images of the alignment mark, rotate one of the images with respect to the other one hundred and eighty degrees and then recombines the two images interferometrically so that when aligned with the alignment target 112, the electromagnetic radiation will interfere either in a polarization sense or in an amplitude sense, constructively or destructively, making readily detectable the center of the alignment mark 112. The optical ray passing through the center of rotation established by the interferometer, 116, defines the sensor alignment axis 118.

A detector 120 receives the electromagnetic radiation from the image rotation interferometer 116. The detector 120 then provides one or more signals to the signal analyzer 122. The signal analyzer 122 is coupled to the substrate table WT or its position sensor IF such that the position of the substrate table WT is known when the center of alignment mark 112 is determined. Therefore, the position of the alignment mark 112 is very accurately known with reference to the substrate table WT. Alternatively, the location of the alignment sensor 100 may be known such that the center of the alignment mark 112 is known with reference to the alignment sensor 100. Accordingly, the exact location of the center of the alignment target 112 is known relative to a reference position.

In an embodiment, the illumination source 104 may comprises a 4-color laser module assembly (LMA) and a polarized multiplexer (PMUX). The LMA is configured to generate four distinct lasers. For example, LMA 30 may generate a 532 nm green wavelength, a 633 nm red wavelength, a 780 nm near infrared wavelength and an 850 nm far infrared wavelength beam of radiation. The polarized multiplexer is configured to multiplex the four laser beams generated by the LMA into a single polarized beam that serves as the illumination source for alignment system 100.

A radiation source with high brightness is desirable for various processes in lithography such as, for example, measuring the alignment of patterning device and/or substrate, scatterometry, etc. It may also be desirable for the radiation source to have a wide spectral width around a nominal wavelength and which spectral width is adjustable and stable. Further, it may be desirable for the radiation source to have different bandwidths. Further, it may desirable for the radiation source to provide various different colors depending on the target feature size, one or more thin film chemistry (e.g., photoresist, antireflection coating, etc.) and optical characteristics, and/or one or more thin film stack characteristics (e.g., thickness) used in the lithography process. Additionally, it is desirable for the radiation source to have a short coherent length so as to, for example, reduce the coherent interference effects from spurious or ghost reflections.

According to an embodiment, there is provided a radiation source with a relatively broad spectral width around a nominal wavelength. According to an embodiment, the radiation source is provided by coupling a visible laser outputting radiation in the visible region of the electromagnetic spectrum to an input end of an optical fiber and spectrally broadening the radiation in the optical fiber such that an output radiation at an output end of the optical fiber has a spectral width of at least 0.5 nm around a nominal wavelength of the visible output radiation from the laser. To achieve the spectral width of at least 0.5 nm around the nominal wavelength, a parameter of the laser and/or a parameter of the optical fiber may be modulated. For example, the length and/or core size of the optical fiber may be adjusted to provide the spectral width of the output radiation. Additionally or alternatively, a parameter of the laser, such as average power, peak power, pulse width, pulse separation, pulse repetition rate, or any combination selected therefrom, may be adjusted to provide the spectral width of the output radiation. In an embodiment, the spectral width is at least about 400 nm around the nominal wavelength. In an embodiment, wherein the visible laser emits in the green region, the spectral width is selected from the range of about 0.5 nm-10 nm around the nominal wavelength.

Figure 6:
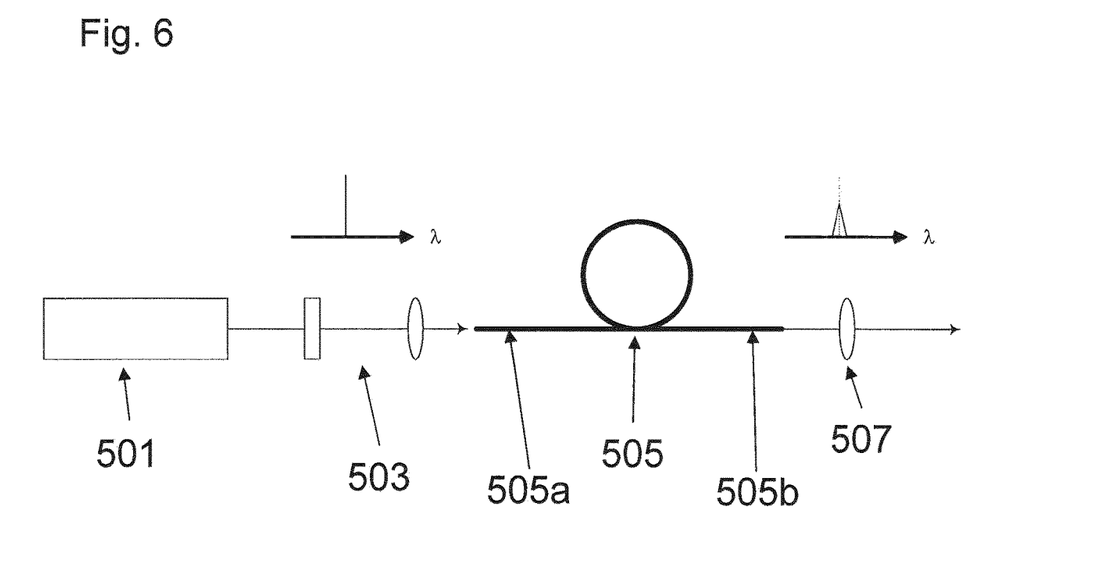
FIG. 6 schematically depicts an embodiment of a short coherence length radiation system in the visible region of the electromagnetic spectrum.

FIG. 6 schematically depicts an embodiment of a short coherence length, broad spectral width radiation system 500 with input radiation in the visible region, e.g., in the green region (e.g., around 532 nm). System 500 includes a visible (e.g., green) laser 501 providing an input radiation to an input end 505a of an optical fiber 505 via one or more optical elements 503 including for example, but not limited to, a collimator, an attenuator, and/or a coupling lens. Output radiation is obtained at an output end 505b of optical fiber 505. The output radiation is then provided to output optics 507 which may include, for example, a collimator, a lens, a prism, a grating, an etalon, a spectral filter, or other optical element. In an embodiment, wavelength sensitive optics, such as a spectral filter, an etalon, or a spectrally dispersive optic such as a prism or a grating coupled with spatial filtering, with their pass-band wavelength(s) located within the spectrum of the output radiation can be placed after the fiber to select and/or control the wavelength and spectral width of the spectrally broadened radiation for uses downstream. Thus, in an embodiment, there is provided a band-pass filter, at or downstream of the output of the optical fiber, to reduce and/or control the wavelength and spectral width of the output radiation. For example, the spectral width may be larger than desired and the band-pass filter can reduce the spectral width or select a certain spectral width of the output spectral width. In an embodiment, the band-pass filter is adjustable to provide different amounts of filtering and at different wavelengths. As an example of an adjustable filter, there may be provided an exchanger to put into the beam path a selected one of a plurality of filters, each filter specific to a different wavelength or amount of spectral width. The exchanger might be a rotating wheel that rotates different filters into the beam path. The radiation from output optics 507 is then provided to a target on, for example, substrate W for use in optical measuring.

In an embodiment, the nominal wavelength of the radiation source 501 coincides with the wavelength needed for the optical sensor. The spectral broadening of a laser with its nominal wavelength at or near that required of the optical sensor provides for a more direct, efficient, and reliable means to generate the wide spectral width radiation for the sensor. In other words, the spectral broadening of a laser with its nominal wavelength at or shorter than the wavelengths needed by the sensor is in general more efficient and stable than that with a longer wavelength due to more dominant and efficient nonlinear optical processes involved.

"Visible" or "green" as used herein refers to the electromagnetic spectrum color or color range corresponding to the wavelength of radiation emitted by the laser. Thus, a green laser may refer to a laser having a nominal wavelength selected from the range of about 495 nm to about 570 nm. In certain embodiments, as shown in FIG. 6, the green laser may have a wavelength of about 532 nm. In other embodiments, the green laser may have a wavelength of about 515 nm or about 520 nm. A visible laser may refer to a laser having a nominal wavelength selected from the range of about 390 nm to about 700 nm.

The laser may be a pulsed laser or a continuous wave (CW) laser. While a CW laser is characterized by its average power, a pulsed laser is, typically, characterized by its pulse width, which is the duration of a single pulse of radiation emitted by the laser, and average power, which measures the total energy emitted by the laser per second. Additional parameters that may characterize a pulsed laser include, but are not limited to, peak pulse power, pulse separation, or pulse frequency. Various visible (e.g., green) lasers may have a pulse width as short 1 ps or less or as long as 10's of nanoseconds. Average laser power may vary from about 1 mW to about 10 W. In addition, pulse frequency of various visible (e.g., green) lasers may vary from about 1 kHz to over 100 MHz. In an embodiment, a visible (e.g., green) laser may be a solid state laser such as a microchip laser. The output radiation from a laser may be focused to provide very high brightness. For example, intensities as low as about 50 MW/cm$^2$ or as high as 2 GW/cm$^2$ may be achieved by coupling suitable optics to a laser.

In an embodiment, the optical fiber is an optical fiber that has refractive index change across its cross-section. In an embodiment, the optical fiber is a standard step-index or graded index optical fiber having, for example, a cylindrical cross-section. The optical fiber may be a single mode fiber, a few mode fiber, or a multi-mode fiber. In an embodiment, the optical fiber is a single mode, silica based optical fiber. In an embodiment, the optical fiber has a refractive index that varies dependent on radiation intensity. In an embodiment, the optical fiber may be made from one or more materials, for example, one or more materials selected from undoped or doped silica, fluorozirconate, fluoroaluminate, a chalcogenide glass, a plastic or any other material having a refractive index that varies dependent on radiation intensity. In an embodiment, the optical fiber may comprise a photonic crystal, be structured and/or be a bandgap fiber. But, desirably, in an embodiment, the optical fiber is not mainly a photonic crystal. But, desirably, in an embodiment, the optical fiber is not primarily structured. But, desirably, in an embodiment, the optical fiber is not bandgap optical fiber.

In an embodiment, the spectral broadening results in a spectral width of greater than 0.5 nm about the nominal wavelength. In an embodiment, the spectral broadening results in a spectral width of greater than 2 nm about the nominal wavelength.

In an embodiment using a green laser, the spectral width is relatively compressed. That is, in an embodiment, the spectral broadening results in a spectral width of greater than or equal to about 0.5 nm and less than or equal to about 10 nm about the green nominal wavelength. In an embodiment, the spectral broadening results in a spectral width of greater than or equal to about 0.7 nm and less than or equal to about 10 nm about the green nominal wavelength. In an embodiment, the spectral broadening results in a spectral width of greater than or equal to about 2 nm and less than or equal to about 10 nm about the green nominal wavelength.

In an embodiment using a visible laser, the spectral width is relatively wide. In an embodiment, the spectral broadening results in a supercontinuum. In an embodiment, the supercontinuum has a spectral width of greater than or equal to about 350 nm, greater than or equal to 400 nm, greater than or equal to 500 nm, or greater than or equal to 900 nm about the nominal wavelength. In an embodiment, the supercontinuum has a spectral width of selected from the range of about 400 nm to 900 nm.

In an embodiment, the spectral width is symmetrical about the nominal wavelength. In an embodiment, the spectral width is asymmetrical about the nominal wavelength. In an embodiment, where the spectral width is asymmetrical, about 5% or less, about 10% or less, about 20% or less, about 30% or less, or about 40% or less of the spectral width is lower than the nominal wavelength.

For pulsed laser radiation or laser radiation with intensity modulation, a nonlinear optical process is self-phase modulation (SPM), which occurs in a nonlinear optical medium with a refractive index that varies depending on radiation intensity. The SPM of an optical fiber may be mathematically described by the equation:

$$n = n_0 + n_2 I \quad (1)$$

where n is the intensity-varying refractive index of the optical fiber, $n_0$ is the nominal refractive index of the optical fiber and $n_2$ is the electro-optic coefficient of the optical fiber. The electro-optic coefficient is specific to the material of the fiber. For example, silica has an electro-optic coefficient of about $3.2 \times 10^{-20}$ m$^2$/W. The phase change $\Delta\varnothing$ over a fiber length L is then:

$$\Delta\varnothing(t) \approx dn \cdot k \cdot L = n_2 I(t) k \cdot L \quad (2)$$

and the resultant frequency broadening $\Delta v(t)$ is:

$$\Delta v(t) \approx -\frac{d(\Delta\phi(t))}{dt} = -n_2 L \frac{1}{\lambda} \frac{dI(t)}{dt} \quad (3)$$

where $\lambda$ is the wavelength of the input laser radiation.

Thus, generally, the amount of spectral broadening is proportional to the length of the fiber L and is larger for shorter pulses, where the rate of intensity change in time is faster. Thus, different bandwidths and powers of the spectrally broadened visible (e.g., green) radiation generated in the system can be achieved by changing the power of the laser, the pulse width of the laser, the core size of the optical fiber and/or the length of the optical fiber. The spectral width of the output radiation can be increased with higher input pump power and/or longer fiber length. To be sure, while the proportionalities in the above equations should hold for supercontinuum spectral broadening, the actual results from the above equations may not yield accurate results for supercontinuum spectral broadening due to the non-linearity of the optical process.

As an example, by coupling a 50 ps, 10 MHz, ~1 W (average power) 532 nm laser output into a 75 m long, 4 μm core diameter silica optical fiber, more than 6 nm spectral broadening can be achieved for silica. Similarly, for example, by coupling a 100 ps, 10 MHz, ~1 W (average power) 532 nm laser output into a 75 m long, 4 μm core diameter silica optical fiber, more than 3 nm spectral broadening can be achieved.

At sufficiently high intensities, non-linear effects of SPM may be enhanced by other non-linear processes such as cross-phase modulation (XPM), modulation instability (MI), stimulated Raman scattering (SRS), and four-wave mixing (FWM). These processes may result in further spectral broadening in excess of 100 nm, producing a supercontinuum radiation output. For example, to produce supercontinuum broadening, the optical fiber length would be long, the laser input radiation power would be high and/or the pulse length would be short.

In Raman scattering, radiation called Stokes (anti-Stokes) radiation with frequencies downshifted (upshifted) from the input laser frequency are generated in the laser radiation. With sufficient laser intensity and interaction length in the medium, the Stokes radiation can grow and deplete the input energy in the case of SRS. The cascade of the SRS processes generates more low frequency radiation. In the presence of both intense input and Stokes radiation, anti-Stokes radiation can be generated during SRS with frequencies upshifted from the input frequency. The frequency shifts are dependent on the vibrational modes of the medium.

In addition to Raman scattering, additional frequencies can be generated with the four-wave mixing (FWM) process in which multiple radiation fields interact to create a new radiation field in which the total energy is conserved and phase matching of the radiation fields is achieved. Further, the spectral broadening of the radiation by SPM and XPM can cause the spectra of the radiation to widen and merge and form a supercontinuum.

The threshold radiation intensity $P_{th}$ for SRS in an optical fiber with a Raman gain coefficient $g_r$, core diameter d, and attenuation coefficient $\alpha$ is approximated by:

$$P_{th} \approx \frac{16\alpha}{C_R} \quad (4)$$

with $$C_R = \frac{g_r}{A_{eff}} = \frac{g_r}{\pi\left(\frac{d}{2}\right)^2} \quad (5)$$

For a pump laser at 532 nm in silica fiber with a 4 μm core diameter, $g_r$ is ~5×10$^{-13}$ m/W, $\alpha$ is typically ~15 dB/km, and the $P_{th}$ is less than 2 W for a fiber length (~1/$\alpha$) of ~300 m. The length of the fiber is reduced with higher pump power.

It should be noted that the spectral broadening achieved by coupling of the laser radiation into an optical fiber may not be symmetrical around the nominal wavelength of the laser radiation. The spectral range obtained through such spectral broadening may be governed by the above mathematical equations. However, a symmetrical spectral broadening may be achieved using suitable parameter values in some embodiments or by appropriate downstream spectral filtering/selection optics.

In various embodiments, very high intensity radiation may have to be coupled into the optical fiber to achieve sufficiently high spectral broadening. Such a high intensity may cause, in some instances, damage to the input facet of the optical fiber from the heat produced while the radiation is coupled into the fiber. This, in turn, may lead to unreliable coupling, particular, for long lifetime applications.

Figure 7A:
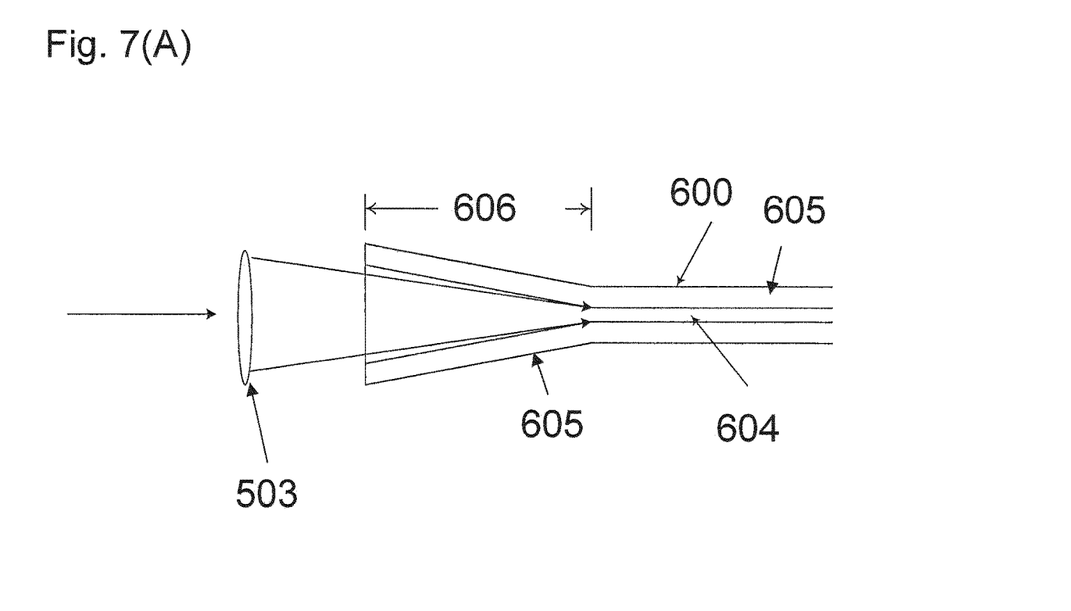
FIGS. 7(A)-(C) schematically depict embodiments of a fiber input facet designed to reduce optical damage to the optical fiber.

FIG. 7(A) schematically depicts an embodiment of a fiber input facet designed to reduce optical damage to the optical fiber. As shown in FIG. 7(A), a tapered facet 606 having a core width (e.g., diameter) larger (e.g., 8 μm) than the width (e.g., diameter) (e.g., 4 μm) of the core 604 of the fiber 600 can be provided at the input end 505a of optical fiber 505 such that a larger laser beam spot may be coupled to the fiber, thereby reducing the intensity at the input facet. The tapered facet 606 can be formed, for example, by expanding the fiber cladding 605. Since, the intensity is inversely proportional to the square of the beam spot width (e.g., diameter), increasing the width of the input facet as shown in FIG. 7(A) can significantly reduce the optical damage to the input facet of the optical fiber.

Figure 7B:
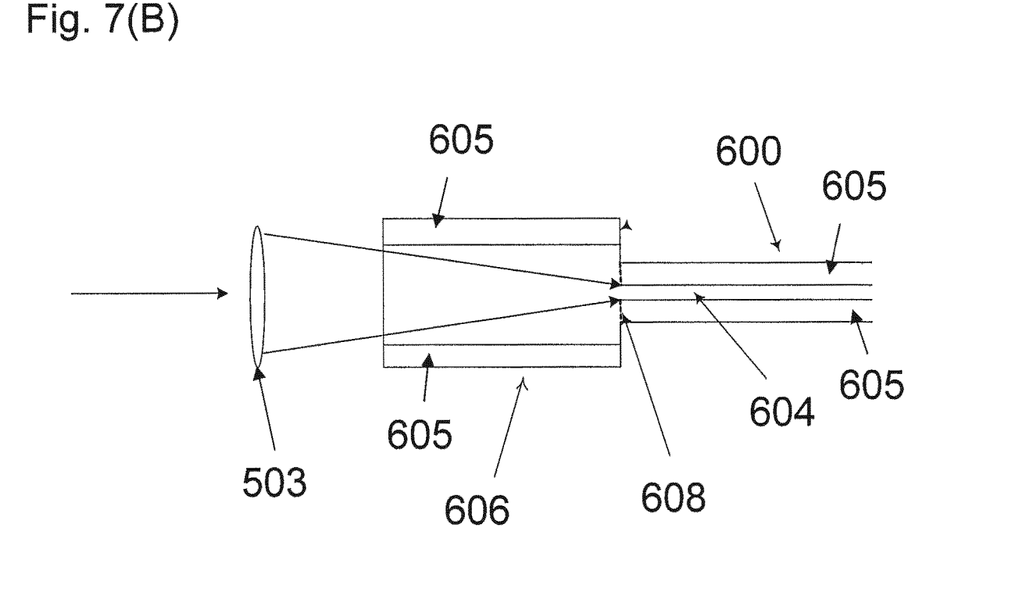
Figure 7C:
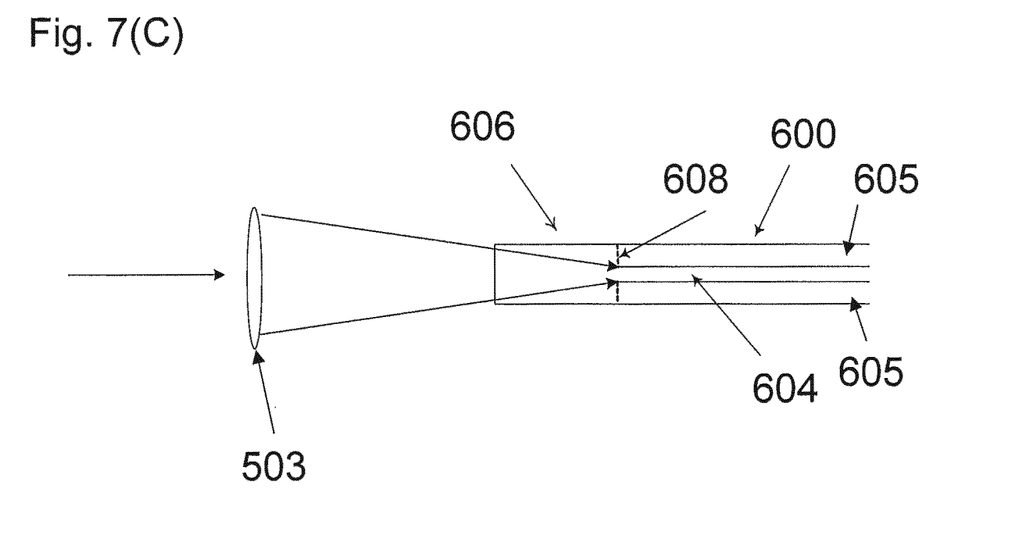

FIG. 7(B) schematically depicts a further embodiment of a fiber input facet designed to reduce optical damage to the optical fiber. In this embodiment, a transparent end cap 606 can be attached or fused at a junction 608 to the input end 505a of the optical fiber 505. The end cap 606 allows for a larger beam spot width on the input face of the fiber 600. Like FIG. 7(B), FIG. 7(C) schematically depicts a further embodiment of a fiber input facet designed to reduce optical damage to the optical fiber. In this embodiment, a transparent end cap 606 can be attached or fused at a junction 608 to the input end 505a of the optical fiber 505. This end cap 606 may not have cladding 605.

Coherence length of a radiation source is inversely proportional to its spectral width. Thus, by broadening the spectral width of the radiation from the laser, the coherence length of the source may be shortened. For example, a coherence length of less about 750 microns can be achieved. For example, a coherence length selected from the range of about 400 microns to about 750 microns can be achieved. In an embodiment, a coherence length of less about 0.5 mm can be achieved. Short coherence length is advantageous because it can, for example, reduce the interference effect of spurious or ghost reflections present during, for example, alignment. In various embodiments, the coherence length of the radiation source provided herein is selected from the range of about 400 µm to about 750 µm. Obviously, the actual coherence length of the source will depend on the nominal wavelength and the coherence length of the input radiation source (e.g., the green laser), and the spectral widening achieved as described herein.

In an embodiment, the visible laser and optical fiber as described herein used to broaden the nominal wavelength of the laser may advantageously reduce coherence offset effects in optical sensors, e.g., optical sensors for lithographic applications such as an optical sensor of an alignment detector. For example, an alignment sensor may require bright short coherence length radiation in the visible and the broadening as described herein may reduce the coherence effects in such sensor caused by such bright short coherence length radiation. The coherence offset effects arise from, e.g., cavities between optical elements in an alignment sensor. Such cavities may largely be uncorrectable and so the broadening can compensate therefor. The short coherence length and broadening as described can reduce 15 pm or more of alignment offset arising from such coherence effects.

The spectral width of the radiation source described herein can be reliably and easily modulated by, e.g., modulating one or more parameters of the input radiation source (e.g., the green laser). For example, spectral width may be increased by decreasing the pulse width (i.e., increasing the rate of change of intensity), or increasing the intensity of the input radiation or the spectral width may be decreased by increasing the pulse width (i.e., decreasing the rate of change of radiation intensity), or decreasing the intensity of the input radiation. Additionally or alternatively, the spectral width may be increased by increasing the length of the optical fiber through which the radiation is passed or increasing the nonlinear optical coefficient of the optical fiber, or decreased by decreasing the length of the optical fiber through which the radiation is passed or decreasing the electro optic coefficient of the optical fiber.

Since visible (e.g., green) lasers are widely available and are part of established technology, using the laser to provide a short coherence length, broad spectral width radiation source around the nominal visible wavelength could advantageously result in minimal disruption to existing setups, while advantageously providing an efficient, reliable and tunable means of broadening the spectral width of the laser.

In an embodiment, there is provided a spectrally broadened radiation apparatus, comprising: a laser configured to emit, through an output of the laser, radiation substantially only in the green region of the electromagnetic spectrum, the radiation having a nominal wavelength; and an optical fiber optically coupled to the output of the laser, the optical fiber having an input to receive the radiation from the laser and having an output to provide spectrally broadened output radiation, the optical fiber configured to spectrally broaden the radiation from the laser to a spectral width of at least 0.5 nm around the nominal wavelength. In an embodiment, the spectral width of the output radiation is less than or equal to about 10 nm. In an embodiment, the spectral width of the output radiation is about 400 nm or more. In an embodiment, the apparatus further comprises a control system configured to modulate a parameter of the laser such that the output radiation has a spectral width of at least about 0.5 nm around the nominal wavelength. In an embodiment, the parameter of the laser comprises average power, peak power, pulse width, pulse repetition rate, or any combination selected therefrom.

In an embodiment, there is provided a spectrally broadened radiation apparatus, comprising: a laser configured to emit, through an output of the laser, radiation substantially only in the visible region of the electromagnetic spectrum, the radiation having a nominal wavelength; and an optical fiber optically coupled to the output of the laser, the optical fiber having an input to receive the radiation from the laser and having an output to provide spectrally broadened output radiation, the optical fiber configured to spectrally broaden the radiation from the laser to a spectral width of at least about 400 nm around the nominal wavelength. In an embodiment, the spectral width of the output radiation is less than or equal to about 900 nm. In an embodiment, the spectral width is asymmetric about the nominal wavelength with a lower proportion of the spectral width below the nominal wavelength. In an embodiment, the apparatus further comprises a control system configured to modulate a parameter of the laser such that the output radiation has a spectral width of at least about 400 nm around the nominal wavelength. In an embodiment, the parameter of the laser comprises average power, peak power, pulse width, pulse repetition rate, or any combination selected therefrom.

In an embodiment, the optical fiber has a material having a refractive index that varies in dependence on an intensity of radiation incident on it. In an embodiment, the optical fiber is not mainly photonic crystal, is not a bandgap fiber and is not primarily structured. In an embodiment, the optical fiber is a single-mode fiber or few mode fiber. In an embodiment, the optical fiber is a step index or graded index fiber. In an embodiment, the laser is a pulsed laser. In an embodiment, the apparatus further comprises a band-pass filter, at or downstream of the output of the optical fiber, to reduce and/or control the spectral width of the output radiation.

In an embodiment, there is provided a measurement apparatus, comprising: a radiation apparatus as described herein; an output to provide the radiation from the radiation apparatus onto a diffraction target; and a detector configured to receive diffracted radiation from the target. In an embodiment, the detector is configured to determine alignment of two or more objects responsive to the received diffracted radiation.

In an embodiment, there is provided an alignment sensor, comprising a radiation apparatus as described herein; an output to provide the radiation from the radiation apparatus onto a target; a detector configured to receive radiation from the target; and a control system configured to determine alignment of two or more objects responsive to the received radiation.

In an embodiment, there is provided a method comprising: outputting radiation from a laser configured to provide radiation substantially only in the green region of the electromagnetic spectrum, the radiation having a nominal wavelength; receiving the radiation at an input of an optical fiber; and spectrally broadening the radiation in the optical fiber such that an output radiation at an output of the optical fiber has a spectral width of at least about 0.5 nm around the nominal wavelength.

In an embodiment, there is provided a method comprising: outputting radiation from a laser configured to provide radiation substantially only in the visible region of the electromagnetic spectrum, the radiation having a nominal wavelength; receiving the radiation at an input of an optical fiber; and spectrally broadening the radiation in the optical fiber such that an output radiation at an output of the optical fiber has a spectral width of at least about 400 nm around the nominal wavelength.

An embodiment of the invention may take the form of a computer program containing one or more sequences of machine-readable instructions describing a method as disclosed herein, or a data storage medium (e.g. semiconductor memory, magnetic or optical disk) having such a computer program stored therein. Further, the machine readable instruction may be embodied in two or more computer programs. The two or more computer programs may be stored on one or more different memories and/or data storage media.

Any controllers described herein may each or in combination be operable when the one or more computer programs are read by one or more computer processors located within at least one component of the lithographic apparatus. The controllers may each or in combination have any suitable configuration for receiving, processing, and sending signals. One or more processors are configured to communicate with the at least one of the controllers. For example, each controller may include one or more processors for executing the computer programs that include machine-readable instructions for the methods described above. The controllers may include data storage medium for storing such computer programs, and/or hardware to receive such medium. So the controller(s) may operate according the machine readable instructions of one or more computer programs.

Although specific reference may have been made above to the use of embodiments in the context of optical lithography, it will be appreciated that an embodiment of the invention may be used in other applications, for example imprint lithography, and where the context allows, is not limited to optical lithography. In imprint lithography, a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

Further, although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including near infrared radiation (e.g., radiation having a wavelength in the range of about 700 nm to about 1400 nm), visible radiation (e.g., radiation having a wavelength in the range of about 390 nm to about 700 nm, e.g., about 633 nm or in the range of about 495 nm to about 570 nm, e.g., about 515 nm, about 520 nm, or about 532 nm), ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

The descriptions above are intended to be illustrative, not limiting. Thus, it will be apparent to one skilled in the art that modifications may be made to the invention as described without departing from the scope of the claims set out below. For example, one or more aspects of one or more embodiments may be combined with or substituted for one or more aspects of one or more other embodiments as appropriate. Therefore, such adaptations and modifications are intended to be within the meaning and range of equivalents of the disclosed embodiments, based on the teaching and guidance presented herein. It is to be understood that the phraseology or terminology herein is for the purpose of description by example, and not of limitation, such that the terminology or phraseology of the present specification is to be interpreted by the skilled artisan in light of the teachings and guidance. The breadth and scope of the invention should not be limited by any of the above-described exemplary embodiments, but should be defined only in accordance with the following claims and their equivalents.

What is claimed is:

1. A spectrally broadened radiation apparatus, comprising:
    a laser configured to emit, through an output of the laser, radiation substantially only in the green region of the electromagnetic spectrum, the radiation having a nominal wavelength; and
    a single mode optical fiber optically coupled to the output of the laser, the optical fiber having an input to receive the radiation from the laser and having an output to provide spectrally broadened, coherent output radiation with a coherence length of about 750 microns or less, the optical fiber configured to spectrally broaden the radiation from the laser to a spectral width of at least 0.5 nm around the nominal wavelength.

2. The apparatus of claim 1, wherein the spectral width of the output radiation is less than or equal to about 10 nm.

3. The apparatus of claim 1, wherein the spectral width of the output radiation is about 400 nm or more.

4. The apparatus of claim 1, further comprising a control system configured to modulate a parameter of the laser such that the output radiation has a spectral width of at least about 0.5 nm around the nominal wavelength.

5. The apparatus of claim 4, wherein the parameter of the laser comprises average power, peak power, pulse width, pulse repetition rate, or any combination selected therefrom.

6. A spectrally broadened radiation apparatus, comprising:
    a laser configured to emit, through an output of the laser, radiation substantially only in the visible region of the electromagnetic spectrum, the radiation having a nominal wavelength; and
    a single mode optical fiber optically coupled to the output of the laser, the optical fiber having an input to receive the radiation from the laser and having an output to provide spectrally broadened, coherent output radiation with a coherence length of about 750 microns or less, the optical fiber configured to spectrally broaden the radiation from the laser to a spectral width of at least about 400 nm around the nominal wavelength.

7. The apparatus of claim 6, wherein the spectral width of the output radiation is less than or equal to about 900 nm.

8. The apparatus of claim 6, wherein the spectral width is asymmetric about the nominal wavelength with a lower proportion of the spectral width below the nominal wavelength.

9. The apparatus of claim 6, further comprising a control system configured to modulate a parameter of the laser such that the output radiation has a spectral width of at least about 400 nm around the nominal wavelength.

10. The apparatus of claim 9, wherein the parameter of the laser comprises average power, peak power, pulse width, pulse repetition rate, or any combination selected therefrom.

11. The apparatus of claim 1, wherein the optical fiber has a material having a refractive index that varies in dependence on an intensity of radiation incident on it.

12. The apparatus of claim 1, wherein the optical fiber is not mainly photonic crystal, is not a bandgap fiber and is not primarily structured.

13. The apparatus of claim 1, wherein the optical fiber is a step index or graded index fiber.

14. The apparatus of claim 1, wherein the laser is a pulsed laser.

15. The apparatus of claim 1, further comprising a bandpass filter, at or downstream of the output of the optical fiber, to reduce and/or control the spectral width of the output radiation.

16. A measurement apparatus, comprising:
a radiation apparatus according to claim 1;
an output to provide the radiation from the radiation apparatus onto a diffraction target; and
a detector configured to receive diffracted radiation from the target.

17. The measurement apparatus of claim 16, wherein the detector is configured to determine alignment of two or more objects responsive to the received diffracted radiation.

18. An alignment sensor, comprising:
a radiation apparatus according to claim 1;
an output to provide the radiation from the radiation apparatus onto a target;
a detector configured to receive radiation from the target; and
a control system configured to determine alignment of two or more objects responsive to the received radiation.

19. A method comprising:
outputting radiation from a laser configured to provide radiation substantially only in the green region of the electromagnetic spectrum, the radiation having a nominal wavelength;
receiving the radiation at an input of a single mode optical fiber; and
spectrally broadening the radiation in the optical fiber such that a coherent output radiation with a coherence length of about 750 microns or less at an output of the optical fiber has a spectral width of at least about 0.5 nm around the nominal wavelength.

20. A method comprising:
outputting radiation from a laser configured to provide radiation substantially only in the visible region of the electromagnetic spectrum, the radiation having a nominal wavelength;
receiving the radiation at an input of a single mode optical fiber; and
spectrally broadening the radiation in the optical fiber such that a coherent output radiation with a coherence length of about 750 microns or less at an output of the optical fiber has a spectral width of at least about 400 nm around the nominal wavelength.

21. A measurement apparatus, comprising:
a radiation apparatus according to claim 6;
an output to provide the radiation from the radiation apparatus onto a diffraction target; and
a detector configured to receive diffracted radiation from the target.

22. The apparatus of claim 6, wherein the optical fiber has a material having a refractive index that varies in dependence on an intensity of radiation incident on it.

23. The apparatus of claim 6, wherein the optical fiber is not mainly photonic crystal, is not a bandgap fiber and is not primarily structured.

* * * * *